United States Patent
Haas et al.

(10) Patent No.: US 6,207,028 B1
(45) Date of Patent: Mar. 27, 2001

(54) SPUTTERING DEVICE WITH A CATHODE WITH PERMANENT MAGNET SYSTEM

(75) Inventors: Dieter Haas, Bruchköbel; Wolfgang Buschbeck, Hanau; Jörg Krempel-Hesse, Eckartsborn, all of (DE)

(73) Assignee: Leybold Systems GmbH (DE)

( * ) Notice: Subject to any disclaimer, the term of this patent is extended or adjusted under 35 U.S.C. 154(b) by 0 days.

(21) Appl. No.: 09/371,605

(22) Filed: Aug. 10, 1999

(30) Foreign Application Priority Data

Aug. 10, 1998 (DE) .............................. 198 36 125

(51) Int. Cl.[7] .............................. C23C 14/00; C23C 14/32
(52) U.S. Cl. .............................. 204/298.19; 204/298.18; 204/298.21; 204/298.12; 204/298.09; 204/192.12
(58) Field of Search .......................... 204/298.19, 298.18, 204/298.21, 298.12, 298.09, 192.12

(56) References Cited

U.S. PATENT DOCUMENTS

| 4,265,729 | * | 5/1981 | Morrison, Jr. | 204/298.19 |
| 4,461,688 |   | 7/1984 | Morrison, Jr. | 204/298.19 |
| 5,021,139 | * | 6/1991 | Hartig et al. | 204/298.19 |
| 5,066,381 | * | 11/1991 | Ohta et al. | 204/298.12 |
| 5,421,978 | * | 6/1995 | Schuhmacher et al. | 204/298.19 |

FOREIGN PATENT DOCUMENTS

| 672319 | 11/1989 | (CH) | C23C/14/34 |
| 2920780 | 3/1980 | (DE) | C23C/14/34 |
| 4301516 | 7/1994 | (DE) | H01J/37/34 |
| 19607803 | 9/1997 | (DE) | C23C/14/54 |
| 19614487 | 10/1997 | (DE) | H01J/37/34 |
| 0431253 | 6/1991 | (EP) | H01J/37/34 |
| 0704878 | 4/1996 | (EP) | H01J/37/34 |
| 2434479 | 3/1980 | (FR) | H01J/37/34 |

* cited by examiner

*Primary Examiner*—Nam Nguyen
*Assistant Examiner*—Daborah Chacko-Davis
(74) *Attorney, Agent, or Firm*—Smith, Gambrell & Russell, LLP

(57) ABSTRACT

In a sputtering device with magnetic amplification, a magnetic field is generated by means of a permanent magnet system, whose lines of force run above and penetrate the sputtering surface, whereby the permanent magnet system is formed of two dosed, coaxial circular or oval rows (7, 8) of individual magnets (5, 5' . . . , 6, 6' . . . ) that are connected via a yoke (15), whereby the surface of the target (3) that faces away from the rows of permanent magnets (7, 8) is formed of two partial surfaces (3a, 3b) that form an angle to each other and whereby the edge (3c) that is formed by the two partial surfaces (3a, 3b) runs parallel to the two rows (7, 8) of permanent magnets (5, 5' . . , 6, 6' . . . ) and whereby an insert (14) made of ferromagnetic material is inserted between the magnetic yoke (15) and the surface of the target (3) that faces the magnetic yoke (15).

14 Claims, 2 Drawing Sheets

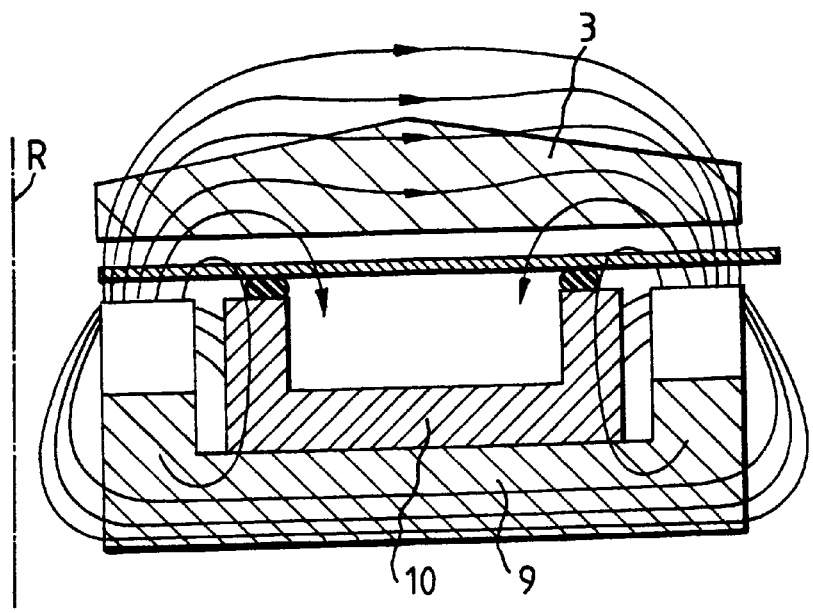
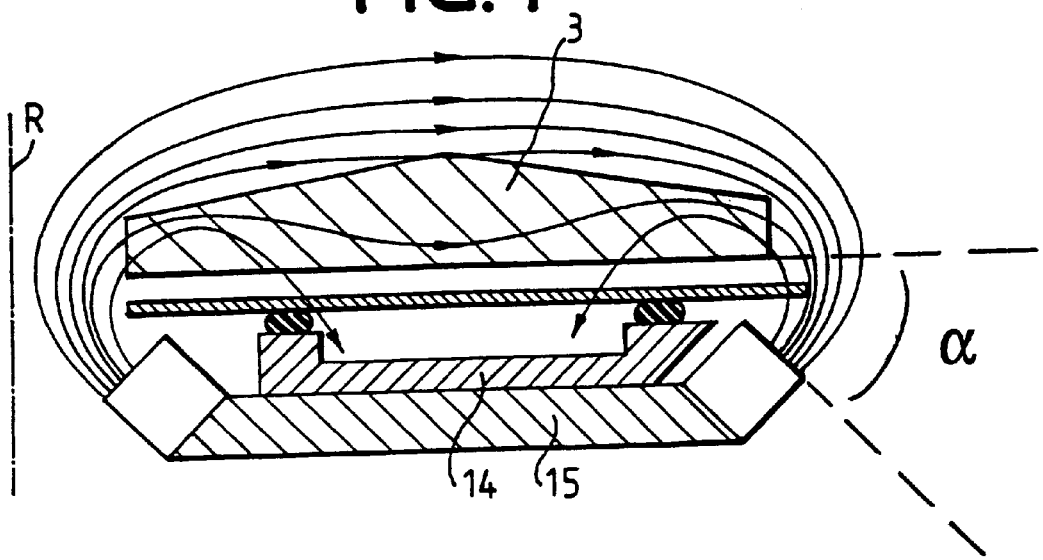

SPUTTERING DEVICE WITH A CATHODE WITH PERMANENT MAGNET SYSTEM

INTRODUCTION AND BACKGROUND

The present invention concerns a sputtering device with magnetic amplification by means of a permanent magnet system that is located on the side of a target that faces away from the sputtering surface of the target and that generates a magnetic field, whose lines of force run above and penetrate the sputtering surface; with a cathode that is formed at least in part by the sputtering surface; and by an anode that is located at a distance from the cathode for the generation of an electric field, whereby the permanent magnets are connected via a yoke made of soft iron.

A sputtering device is known of the general type in question (German DE 29 20 780 C2) in which measures have been taken to establish a flat profile for the magnetic field lines over the sputtering surface; therefore, the permanent magnet system is formed by a combination of a number of individual magnetic elements whose orientation relative to each other has been chosen so that the lines of force of the magnetic field run parallel to the sputtering surface of the target both inside the magnet system and across a large part of the sputtering surface.

In a particular embodiment of this known sputtering device, the magnetic elements of a first group feature a pole orientation that is set at an angle to the sputtering surface of the target and the magnetic elements of a second group feature a pole orientation that runs parallel to the sputtering surface.

Also known is a sputtering cathode (U.S. 4,461,688) with a plate-shaped target and several U-shaped magnetic units that are positioned on the side of the target facing away from the substrate while the front surfaces of the two arms of a first U-shaped magnetic unit lie against the peripheral areas of the surface of the target and the front surfaces of the arms of another pair of U-shaped magnetic units each lie against one half of the target surface and the front surfaces of both of the arms of another two pairs of smaller U-shaped magnetic units each lie against the outside half of the surface of the target that overlaps the second pair of magnetic units.

Finally, a sputtering cathode based on the magnetron principle has already been proposed (German DE 198 19 785.3) with a target that consists of at least one part of the material to be sputtered and a magnet system that is located behind the target and has sources of different polarity by means of which at least one tunnel of closed loop field lines is formed, whereby the source poles that are oriented away from the target are connected with each other by a magnetic yoke made of soft magnetic material and whereby the bodies that form the sources of the magnetic fields are prisms, preferably cuboids, whose base lines are set parallel to the target plane and the field lines of the sources all run at an angle to the bases of the bodies.

An object of the present invention is a sputtering cathode that has a target with a particularly long life or with a high degree of use of the used target material, that has magnets that are not immersed in cooling fluid and that is suited for a coating process with a high separation rate.

SUMMARY OF THE INVENTION

The above and other objects of the present invention can be achieved by installing, between the two rows of permanent magnets, an insert of ferromagnetic material that preferably has a U-shaped cross section and is configured to fit the yoke, and with a surface that faces away from the target and touches the surface of the magnetic yoke that faces the target and is bounded by the two rows of permanent magnets, whereby the two arms of the insert each extend toward the target at a distance from the rows of permanent magnets.

In an alternative embodiment the surface of the target that faces away from the rows of permanent magnets is formed by two partial surfaces that extend at an angle to each other, thus the edge that the two partial surfaces form with each other runs parallel to the two rows of permanent magnets and an insert made of ferromagnetic material is inserted between the magnetic yoke and the surface of the target that faces the magnetic yoke.

BRIEF DESCRIPTION OF THE DRAWINGS

The present invention will be further understood with reference to the drawings which illustrate two different embodiments; thusly.

FIGS. 3 and 4 show the cathodes according to FIGS. 1 and 2, in a schematic fashion, with the profile of the magnetic field lines indicated.

DETAILED DESCRIPTION OF THE DRAWINGS

Figure 1:
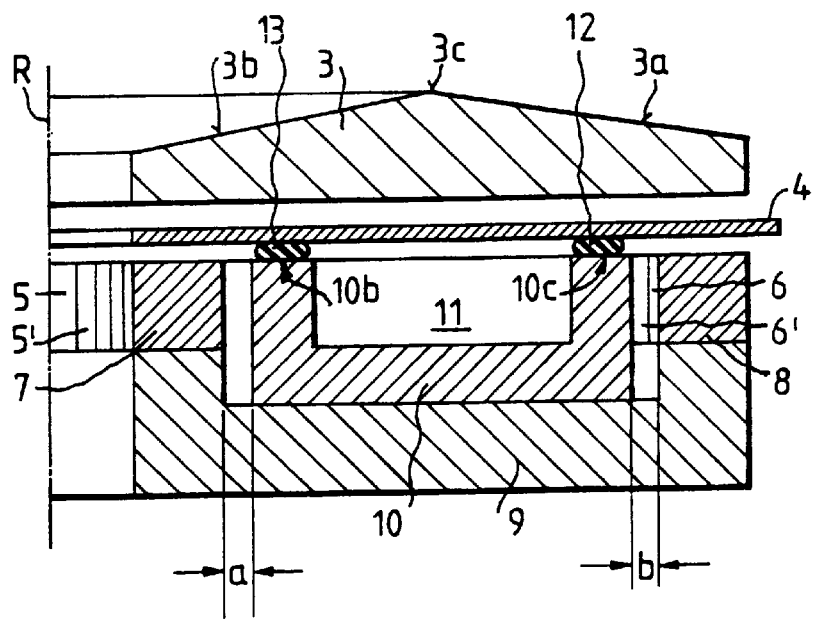
FIG. 1 is a schematic cross-sectional view of a first embodiment of the invention.

The cathode according to FIG. 1 consists of a ring-shaped target 3 with a cross-sectional plane that is shaped as a pentagon, which is formed by two parallel edges of equal length that run perpendicular to the base edge and by two edges that form an angle with each other; a ring-shaped foil section 4; two rows of cylindrical permanent magnets 7, 8 that each consist of several cuboid permanent magnets 5, 5' . . . or 6, 6' . . . ; an approximately ring-shaped cylindrical magnetic yoke 9 with a U-shaped cross section; an insert 10 with a U-shaped cross section that is fitted to that of the magnetic yoke 9 with two vertical portions spaced from vertical portions of said yoke by distances (a, b), the vertical portions being joined by a horizontal portion; a channel 11 that is cut into the insert 10 and closed by the foil section 4; and two seal rings 12, 13 that provide that the coolant that flows through channel 11 does not enter into the area of the cathode where the permanent magnets 5, 5' . . . or 6, 6' . . . are located.

The two partial surfaces of the target 3 that are facing the substrate are designated 3a and 3b; the edge that is formed by the two partial surfaces 3a, 3b is designated 3c. The two front surfaces of the insert 10 that are sealed against the foil section 4 are designated 10b and 10c.

The cathode according to FIG. 2 consists of a ring-shaped target 3, the configuration of which corresponds to that of FIG. 1; a ring-shaped foil section 4 located below the target 3; two seal rings 12, 13; an insert 14 made of ferromagnetic material; a magnetic yoke 15 with an approximately trapezoidal cross section; and two rows of permanent magnets 7, 8 that each consist of several cuboid individual magnets 5, 5', 5" . . . or 6, 6' . . . In contrast to the configuration according to FIG. 1, the cathode according to FIG. 2 has individual cuboid permanent magnets 5, 5', 5" . . . or 6, 6' . . . that are positioned at an angle relative to the target surface or the axis of rotation R, whereby they are attached to the circumferential beveled side surfaces 15a and 15b respectively of the approximately disk-shaped flat yoke 15.

It is to be noted that the sources of the bodies forming the magnetic fields are straight prisms or cuboids 5, 5', 5" . . . , 6, 6' . . . whose base lines are slanted downward or form an angle α with the target surface, whereby the field lines of the sources of the magnetic fields each run parallel with the side edges of the cuboids 5, 5', 5" . . . , 6, 6' . . . .

Figure 2:
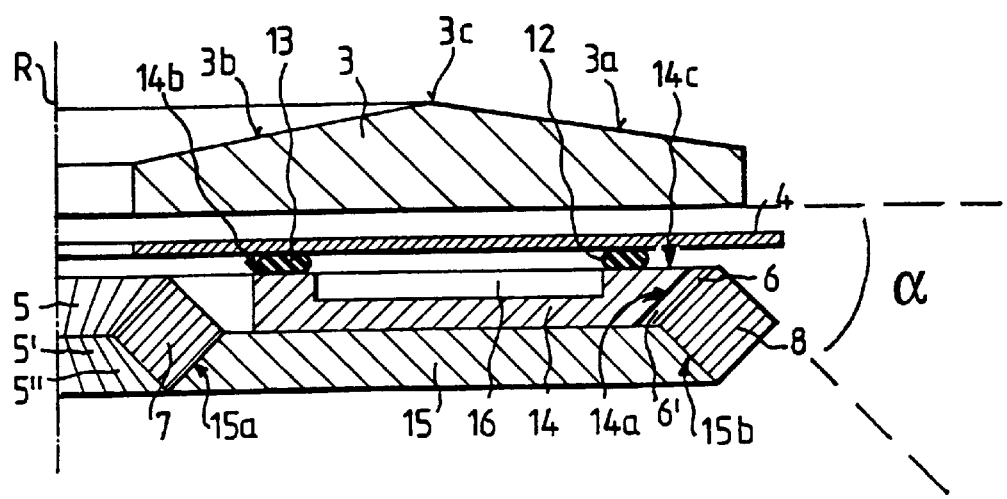
FIG. 2 is a schematic cross-sectional view of a second embodiment of the invention and which show two different ring-shaped cathodes in cross-sectional view. The axis of rotation or the axis of symmetry is designated by R.

As can be seen in FIG. 2 the angle of inclination of the cuboid permanent magnets 5, 5', 5" . . . , 6, 6' . . . (in relation to the target surface) is approximately 45° (see FIG. 4). Insert 14 includes front surfaces 14b and 14c, which are sealed against foil section 4. The insert also includes surface 14a, which is positioned at the same angle as the side of magnets 6, 6'. A channel 16 is cut into the insert 14 in the same manner as channel 11 in FIG. 1.

Further variations and modifications of the foregoing will be apparent to those skilled in the art and are intended to be encompassed by the claims appended hereto.

German priority application 198 36 125.4 filed Aug. 10, 1998 is relied on and incorporated herein by reference.

We claim:

1. A sputtering device with magnetic amplification comprising a permanent magnet system formed of a plurality of permanent magnets located on a side of a target that faces away from a sputtering surface of said target and for generating a magnetic field, whose lines of force run above and penetrate said sputtering surface, with a cathode that is formed at least in part by said sputtering surface; and with an anode located at a distance from said cathode for generation of an electric field, whereby said permanent magnets form a configuration of two closed, coaxial circular or oval rows of a plurality of individual magnets that are connected with each other by means of a magnetic yoke and between said two rows of a plurality of individual magnets there is a U-shaped insert of ferromagnetic material with a configuration fitted to that of said yoke and having a rear horizontal surface that faces away from said target and lies against a surface of said magnetic yoke that faces said target and is bounded by the two rows of permanent magnets whereby two vertical arms of the U-shaped insert each extend at a distance (a, b) from the two rows of permanent magnets in a direction toward said target, said U-shaped insert being confined radially to an area between said two rows of said plurality of individual magnets.

2. The sputtering device according to claim 1 wherein a surface of said U-shaped inser that faces an inside row of permanent magnets is positioned perpendicular to the sputtering surface of said target and the surface of said U-shaped insert that faces an outside row of permanent magnets is configured as a surface that runs at an angle with the plane of said yoke.

3. The sputtering device according to claim 2 wherein the individual magnets of said rows of permanent magnets are configured as straight prisms.

4. The sputtering device according to claim 3 wherein said rows of permanent magnets are configured as cubes or cuboids whose base lines and side lines run at an angle with the sputtering surface of said target.

5. The sputtering device according to claim 1 wherein the individual magnets of said rows of magnets permanent are configured as straight prisms.

6. The sputtering device according to claim 5 wherein said rows of permanent magnets configured as cubes or cuboids whose base lines and side lines run at an angle with the target surface.

7. The sputtering device according to claim 1 wherein said U-shaped insert ferromagnetic material is essentially formed as a flat ring-shaped cylinder or a flat oval ring, whereby a groove or slot-shaped recess that extends parallel to the two rows of permanent magnets is formed in surface of said U-shaped insert made out of ferromagnetic material facing the target and whereby the two partial surfaces of said U-shaped insert that bound the groove radially lie against a plate or a foil section that is positioned between the target and said U-shaped insert forming, together with the groove, the confines of the coolant channel, thus providing a seal.

8. A sputtering device with magnetic amplification comprising a permanent magnet system formed of a plurality of permanent magnets located on a side of a target that faces away from a sputtering surface of said target and for generating a magnetic field, whose lines of force run above and penetrate said sputtering surface, with a cathode that is formed at least in part by said sputtering surface; and with an anode located at a distance from said cathode for generation of an electric field, whereby said permanent magnet system is formed by two closed, coaxial circular or oval rows of a plurality of individual magnets that are connected by a magnetic yoke, wherein a surface of said target that faces away from said two rows of a plurality of individual magnets is formed by two partial surfaces that form an angle with each other, whereby an edge that is formed by the two partial surfaces runs parallel to the rows of permanent magnets and whereby an insert of ferromagnetic material is inserted between said magnetic yoke and said surface of said target that faces said magnetic yoke, said insert having two vertical arms connected by a horizontal arm and being confined radially to an area between said two rows of said plurality of individual magnets.

9. The sputtering device according to claim 8 wherein a surface of said insert that faces an inside row of permanent magnets is positioned perpendicular to the spurttering surface of said target and the surface of said insert that faces an outside row of permanent magnets is configured as a surface that runs at an angle with the plane of said yoke.

10. The sputtering device according to claim 9 wherein the individual magnets of said rows of permanent magnets are configured as straight prisms.

11. The sputtering device according to claim 10 wherein said rows of permanent magnets are configured as cubes or cuboids whose base lines and side lines run at an angle with the sputtering surface of said target.

12. The sputtering device according to claim 8 wherein the individual magnets of said rows of permanent magnets are configured as straight prisms.

13. The sputtering device according to claim 12 wherein said rows of permanent magnets are configured as cubes or cuboids whose base lines and side lines run at an angle with the target surface.

14. The sputtering device according to claim 8 wherein said insert made of ferromagnetic material is essentially formed as a flat ring-shaped cylinder or a flat oval ring, whereby a groove or slot-shaped recess that extends parallel to the two rows of permanent magnets is formed in a surface of said insert made out of ferromagnetic material facing the target and whereby the two partial surfaces of the insert that bound the groove radially lie against a plate or a foil section that is positioned between the target and the insert forming, together with the groove, the confines of the coolant channel, thus providing a seal.

* * * * *